US009614108B1

(12) United States Patent
Sood et al.

(10) Patent No.: US 9,614,108 B1
(45) Date of Patent: Apr. 4, 2017

(54) OPTICALLY-THIN CHALCOGENIDE SOLAR CELLS

(71) Applicant: Magnolia Solar, Inc., Woburn, MA (US)

(72) Inventors: Ashok K. Sood, Brookline, MA (US); Roger E. Welser, Providence, RI (US)

(73) Assignee: Magnolia Solar, Inc., Woburn, MA (US)

( * ) Notice: Subject to any disclaimer, the term of this patent is extended or adjusted under 35 U.S.C. 154(b) by 0 days.

(21) Appl. No.: 14/801,759

(22) Filed: Jul. 16, 2015

Related U.S. Application Data

(62) Division of application No. 13/868,007, filed on Apr. 22, 2013, now abandoned.

(Continued)

(51) Int. Cl.
*H01L 31/0463* (2014.01)
*H01L 31/0216* (2014.01)
*H01L 31/0224* (2006.01)
*H01L 31/0749* (2012.01)
*H01L 31/0725* (2012.01)
*H01L 31/054* (2014.01)
*H01L 31/0236* (2006.01)
*H01L 31/048* (2014.01)
*H01L 31/18* (2006.01)

(52) U.S. Cl.
CPC .. *H01L 31/02168* (2013.01); *H01L 31/02366* (2013.01); *H01L 31/022433* (2013.01); *H01L 31/022466* (2013.01); *H01L 31/0481* (2013.01); *H01L 31/0547* (2014.12); *H01L 31/0725* (2013.01); *H01L 31/0749* (2013.01); *H01L 31/1884* (2013.01)

(58) Field of Classification Search
CPC ...................... H01L 31/02168; H01L 31/0547
See application file for complete search history.

(56) References Cited

U.S. PATENT DOCUMENTS 5,496,415 A   3/1996  Barnham
7,544,884 B2  6/2009  Hollars
(Continued)

OTHER PUBLICATIONS

Welser, et al., "U.S. Appl. No. 12/719,811, Multijunction Solar Cell Employing Extended Heterojunction and Step Graded Antireflecti", Mar. 8, 2010, Published in: US.
(Continued)

*Primary Examiner* — Shannon Gardner
(74) *Attorney, Agent, or Firm* — Loginov & Associates, PLLC; William A. Loginov

(57) ABSTRACT

A photovoltaic device comprises a back reflective coating structure to provide back scattering of light that passes through the photovoltaic device, an absorber structure containing chalcogenide materials, and a top scattering antireflective structure deposited on the top subcell. Illustratively, a multi-junction structure comprises a bottom subcell deposited on the back reflective coating structure, the bottom subcell having a lower band gap, higher index material embedded therein, to provide lateral propagation of light that passes through the photovoltaic device, and a top subcell deposited on the bottom subcell. The multi-junction structure can comprise chalcogenide materials, in which case the top subcell is embedded with an intermediate band gap absorber material.

8 Claims, 6 Drawing Sheets

Related U.S. Application Data

(60) Provisional application No. 61/636,587, filed on Apr. 20, 2012.

(56) References Cited

U.S. PATENT DOCUMENTS

| | | | |
|---|---|---|---|
| 2008/0163929 A1* | 7/2008 | Krasnov | C01G 9/00 136/265 |
| 2010/0180941 A1 | 7/2010 | Lim et al. | |
| 2010/0282314 A1* | 11/2010 | Coakley | H01L 31/0236 136/258 |

OTHER PUBLICATIONS

Welser, et al., "U.S. Appl. No. 12/829,997, Thin Film Solar Cells on Coated Glass and Methods of Constructing the Same", Jul. 2, 2010, Published in: US.

Welser, et al., "U.S. Appl. No. 12/885,718, Thin Film Solar Cells on Flexible Substrates and Methods of Constructing the Same", Sep. 20, 2010, Published in: US.

Welser, et al., "U.S. Appl. No. 12/985,748, Quantum Well Waveguide Solar Cells and Methods of Constructing the Same", Jan. 6, 2011, Published in: US.

Welser, et al., "U.S. Appl. No. 61/449,142, Diffuse Omni-Directional Back Reflectors and Methods of Manufacturing the Same", Jun. 20, 2011, Published in: US.

Welser, et al., "U.S. Appl. No. 61/525,707, High Efficiency Quantum Well Waveguide Solar Cells and Methods for Constructing the Sam", Aug. 19, 2011, Published in: US.

\* cited by examiner

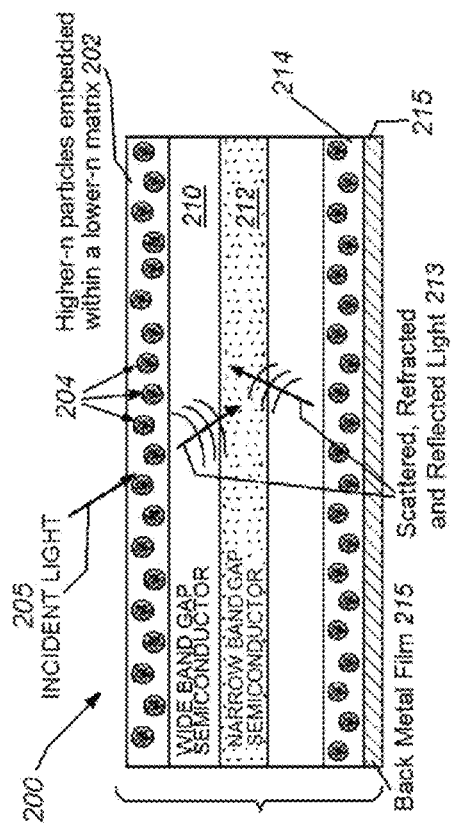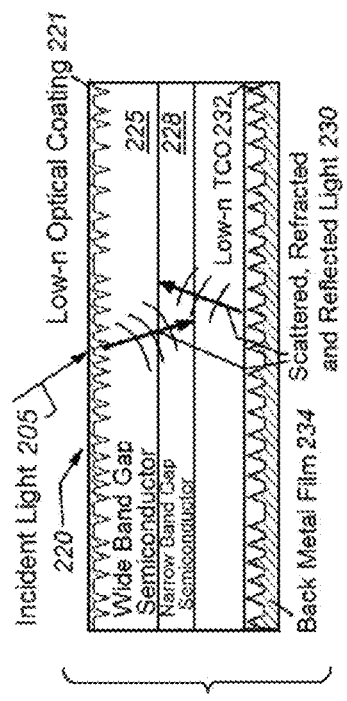

OPTICALLY-THIN CHALCOGENIDE SOLAR CELLS

RELATED APPLICATIONS

This application is a divisional application of co-pending U.S. patent application Ser. No. 13/868,007, filed Apr. 22, 2013, entitled MULTIJUNCTION OPTICALLY-THIN SOLAR CELLS, which application claims the benefit of U.S. Provisional Application Ser. No. 61/636,587, filed Apr. 20, 2012, entitled MULTIJUNCTION OPTICALLY-THIN SOLAR CELLS, the entire disclosures of each are herein incorporated by reference.

FIELD OF THE INVENTION

The present invention relates generally to semiconductor-based photovoltaic energy converters, also known as "solar cells," and to the design and fabrication of the same.

BACKGROUND OF THE INVENTION

With appropriate electrical loading, photovoltaic solid state semiconductor devices, commonly known as solar cells, convert sunlight into electrical power by generating both a current and a voltage upon illumination. The current source in a solar cell is the charge carriers that are created by the absorption of photons. These photogenerated carriers are typically separated and collected by the use of PN or PIN junctions in semiconductor materials. The operational voltage of the device is limited by the dark current characteristics of the underlying PN or PIN junctions, among other limiting characteristics. Thus improving the power output performance of any solid state solar cell generally entails simultaneously maximizing absorption and carrier collection while minimizing dark diode current.

The solar electric conversion efficiency of conventional solar cells decreases as the cell thickness decreases due to incomplete absorption and the resulting decrease in short circuit current. However, the dark current can also decrease with decreasing cell thickness, particularly for photovoltaic devices operating in the radiative limit, resulting in an increase in open circuit voltage. It is desirable to leverage the inherent lower dark current of optically thin absorber layers. By incorporating light trapping structures, optically-thin solar cells can match or even exceed the performance of optically thick photovoltaic devices. Optically-thin photovoltaic devices also offer advantages compared to conventional structures in terms of increased robustness (including enhanced radiation tolerance) and reduced material costs. Photovoltaic modules employing thin-film technologies based upon cadmium telluride (CdTe), amorphous silicon, and copper indium gallium di-selenide (CIGS) materials can be manufactured at lower costs per unit area than crystalline silicon technologies. Thin-film cells use less semiconductor materials than crystalline silicon cells, and can, in some cases, be manufactured in a flexible format. It is desirable to increase the efficiency of thin-film solar cells and lower the cost of photovoltaic systems.

SUMMARY OF THE INVENTION

This invention overcomes the disadvantages of the prior art by providing a solar cell structure that incorporates light trapping structures in an optically-thin cell. Employing advanced light trapping concepts increase the efficiency of CIGS thin-film cells. Highly efficient ultra-thin flexible solar cells combine band gap engineering, light trapping and thin-film device fabrication. Optically-thin solar cells exhibit enhanced radiation tolerance and reduced material costs. In an illustrative embodiment, an optically-thin solar cell or photovoltaic device comprises a back reflective coating structure, a multijunction solar cell structure deposited thereon, and a top scattering antireflection (AR) structure deposited on the multijunction solar cell structure. Illustratively, the multijunction solar cell structure can include a bottom subcell having a lower bandgap, higher index material, and is deposited on the back reflective coating, and a top subcell deposited on the bottom subcell. The efficiency of thin-film cells is increased by employing a high-voltage, ultra-thin diode sandwiched between a forward scattering anti-reflective structure and a diffuse-scattering back reflector.

In accordance with another illustrative embodiment, a photovoltaic device is provided that comprises a back reflective coating structure, a multijunction chalcogenide solar cell structure, and a top scattering AR structure deposited on the multijunction chalcogenide structure. The chalcogenide solar cell structure can comprise a bottom subcell with a lower band gap, higher index material, and a top subcell with an intermediate band gap absorber material.

BRIEF DESCRIPTION OF THE DRAWINGS

The invention description below refers to the accompanying drawings, of which:

FIG. 2A is a schematic cross-sectional side view of a structured film having nanoparticles embedded in a low-n matrix layer, according to an illustrative embodiment;

FIG. 2B is a schematic cross-sectional side view of a structured film having a nanotextured semiconductor surface overcoated with lower index coatings, according to an illustrative embodiment;

DETAILED DESCRIPTION

In an illustrative embodiment, in order to minimize non-radiative recombination and approach the radiative limit of dark current operation, a basic photovoltaic device structure can desirably employ two or more energy gap semiconductor materials, such that the narrow energy gap absorber material is embedded within a higher energy gap matrix. Moreover, the narrow energy gap and wide energy gap materials can be positioned within a PN or PIN junction diode in such a manner that non-radiative processes are largely confined to the wider energy gap material and disposed away from the narrow energy gap material. In general, the wide energy gap material can be composed of multiple layers, as can the narrow energy gap absorber material. In particular, the narrow energy gap, optically-thin absorber layer materials can comprise a single well layer, multiple well layers, multiple quantum dot layers, or multiple layers of quantum dots in a well or any combination thereof within ordinary skill. In accordance with the illustrative embodiments, the absorber layer structure can comprise group III-V materials, group IV materials, chalcogenide materials, or other materials known in the art.

An extended wide band gap emitter structure is one example of this overall photovoltaic absorber structure design concept that can effectively reduce non-radiative n=2 and n=1 components of the dark current. One element of this novel device structure design is the use of wide band gap material both in the emitter layer and in the depletion region adjacent to the emitter. A second critical element of this design is that the heterojunctions between the extended wide band gap emitter material and the base layer, and between the base layer and any narrow band gap well material, be placed within the built-in electric field of the depletion region. An optional third element of this device structure is the use of two or more wide band gap materials with band offsets that hinder the diffusion of carriers from the emitter into the base.

Figure 1:
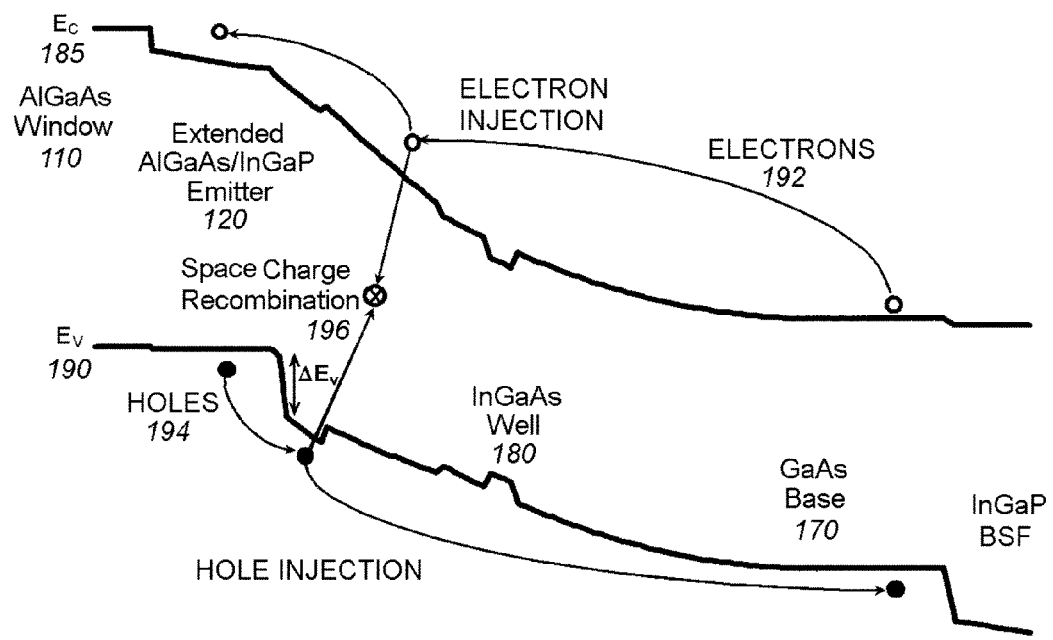
FIG. 1 is a graphical diagram of the energy band versus position for a material structure of a thin film semiconductor solar cell, illustrating various dark diode current mechanisms, in accordance with an illustrative embodiment.

The basic functionality of an extended bang gap emitter structure as applied to InGaAs quantum well solar cells is summarized in FIG. 1. Further details and examples of an extended wide band gap emitter structure are disclosed in commonly assigned U.S. Provisional Pat. App. Ser. No. 61/525,707, entitled HIGH EFFICIENCY QUANTUM WELL WAVEGUIDE SOLAR CELLS AND METHODS FOR CONSTRUCTING THE SAME, by Roger E. Welser and Ashok K. Sood, filed Aug. 19, 2011; U.S. patent application Ser. No. 12/985,748, entitled QUANTUM WELL WAVEGUIDE SOLAR CELLS AND METHODS OF CONSTRUCTING THE SAME, by Roger E. Welser and Ashok K. Sood, filed Jan. 6, 2011; U.S. patent application Ser. No. 12/885,718, entitled THIN FILM SOLAR CELLS ON FLEXIBLE SUBSTRATES AND METHODS OF CONSTRUCTING THE SAME, by Roger E. Welser and Ashok K. Sood, filed Sep. 20, 2010; U.S. patent application Ser. No. 12/829,997, entitled THIN FILM SOLAR CELLS ON COATED GLASS AND METHODS OF CONSTRUCTING THE SAME, by Roger E. Welser and Ashok K. Sood, filed Jul. 2, 2010; and U.S. patent application Ser. No. 12/719,811, entitled MULTIJUNCTION SOLAR CELL EMPLOYING EXTENDED HETEROJUNCTION AND STEP GRADED ANTIREFLECTION STRUCTURES AND METHODS FOR CONSTRUCTING THE SAME, by Roger E. Welser and Ashok K. Sood, filed Mar. 8, 2010, the teachings of which are each expressly incorporated herein by reference.

With reference to FIG. 1, as with conventional heterojunction structures, the larger energy gap of emitter 120 relative to the base 170 reduces the diffusion of electrons 192 out of the n-type base layer. In addition, hole diffusion 194 is suppressed in this structure by placing a thin InGaP layer (not shown) adjacent to the p-type AlGaAs emitter 120. The large valence band offset (ΔE) at the type II InGaP barrier/AlGaAs emitter 120 interface also alters the distribution of holes 194 within the depletion region. By reducing the hole concentration injected from the p-type AlGaAs emitter 120, the region of enhanced recombination within the depletion region can be pulled closer to the p-side of the structure, away from the InGaAs well region 180 and into the wide band gap material in the depletion region adjacent to the emitter, thus reducing space charge recombination 196. The extended AlGaAs emitter 120/InGaP barrier structure illustrated in FIG. 1 thus reduces both the non-radiative n=1 diffusion and n=2 space charge recombination components of the diode dark current.

Reference is now made to FIGS. 2A through 2D detailing schematic cross-sectional side views of optical scattering from structured films according to various illustrative embodiments. In general, optically-thin solar cell structures contain a limited volume of low band gap material, and thus require advanced light trapping structures to increase the current generating capabilities. Light management is achieved by assuring that incident photons are not lost due to reflections but are instead directed into the semiconductor absorbing layers. The scattering of incident light to ensure each photon has a non-normal trajectory is a strategy for increasing the optical path length of photons within the absorption layer. In addition, the application of a back reflector to bounce any unabsorbed photons back up into the active layers of the device is a beneficial aspect of any effective photovoltaic light trapping scheme. The most effective light trapping schemes will simultaneously redirect vertically incident light horizontally into the plane of the absorbing layer.

Enhanced optical properties typically exist when an optical film is three-dimensionally structured and effectively composed of two or more materials. In particular, elastic scattering can occur in films with sub-wavelength structures, altering the angular pattern of light propagation beyond the straightforward application of the physical optics laws of refraction and reflection, as shown by the scattered, refracted and reflected light in FIGS. 2A-2D. Structured films can be formed from optical coatings that also incorporate nanoparticles (FIG. 2A) or nanorods (FIG. 2C) which differ in refractive index from that of their surrounding material. Alternatively, structured films can comprise etched semiconductor materials that are either left uncoated or overcoated with a lower refractive index material (FIG. 2B), or can result from conformal deposition on a nanostructured substrate (FIG. 2D). Examples of optical scattering from these various types of structured films are depicted in FIGS. 2A-2D.

Referring to FIG. 2A, a schematic cross-sectional side view of a photovoltaic device 200 showing optically scattering from structured films comprised of nanoparticles embedded within an optical film is shown. The application of a nanostructured graded-refractive-index (GRIN) optical coating minimizes reflection losses and maximizes photon recycling in thin-film solar cells. By adjusting the dimensions of the nanostructures within the optical coatings, the scattering efficiency into laterally propagating optical modes is increased, thereby significantly enhancing the optical path length of incident photons. In accordance with an illustrative embodiment, diffuse scattering nanostructured optical coatings are applied to both sides of the device to maximize the light trapping within the ultra-thin layers.

The photovoltaic device 200 includes a top layer 202 of higher-n particles 204 embedded within a lower-n matrix. As incident light 205 passes through the top nanoparticle embedded layer, it is scattered into the wide band gap semiconductor material 210. The scattering cross-section and re-radiation patterns are a function of the particle size and shape, as well as the wavelength of the incident light and the optical constants of the particle and surrounding material. As the diameter of the nanoparticles approaches the wavelength of incident light, elastic scattering can alter the angular pattern of light propagation. The surrounding medium can also strongly influence the re-radiation pattern. Scattering strength can also be locally enhanced by the formation of surface plasmon polaritons on metallic particles (not shown, but readily applicable to those having skill). The refracted light 213 then passes through a narrow band gap semiconductor 212 and onto the back nanoparticle embedded film layer 214. This causes scattered, refracted and reflected light to be re-directed back into the narrow back gap semiconductor material 212. A back metal film 215 is also provided, onto which the back nanoparticle embedded film layer 214 is deposited.

Reference is now made to FIG. 2B showing a schematic cross-sectional side view of a photovoltaic device 220 and the associated optical scattering from the nanotextured semiconductor surfaces overcoated with lower index coatings, according to an illustrative embodiment. For a more detailed description of the process for obtaining a nanotextured semiconductor surface overcoated with an optical film, refer to commonly assigned (61/613,262). As shown in FIG. 2B, incident light 205 passes through a nanotextured low-n optical coating 221, and enters the wide band gap semiconductor material 225, the light is scattered and passes through to the narrow band gap semiconductor material 228. The path of travel of the scattered, refracted and reflected light 230 is shown, and when the light reaches the low-n material such as a transparent conductive oxide (TCO) 232, the light is scattered, refracted and reflected back into the narrow band gap semiconductor material and wide band gap semiconductor material. Nanotexturing the back metal film, and then overcoating with a low-n TCO film, can be employed to construct structured films for optical scattering. As the diameter of the nanotexturing approaches the wavelength of the incident light, elastic scattering can alter the angular pattern of light propagation. Likewise, the surrounding medium can also strongly influence the re-radiation pattern.

Figure 2C:
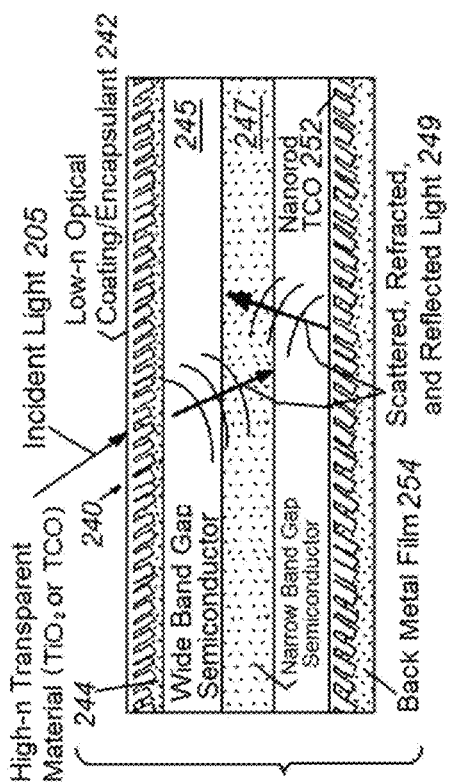
FIG. 2C is a schematic cross-sectional side view of a structured film having a nanotextured semiconductor surface overcoated with nanorod materials, according to an illustrative embodiment.
Figure 2D:
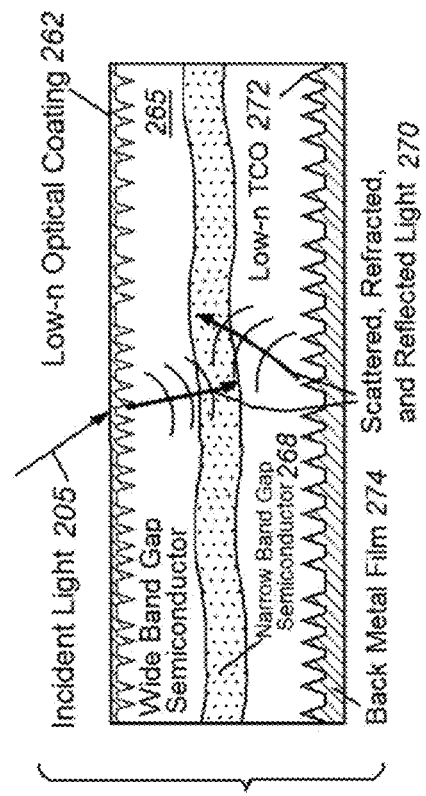
FIG. 2D is a schematic cross-sectional side view of a structured film resulting from conformal deposition on a nanostructured substrate, according to an illustrative embodiment.

Reference is now made to FIG. 2C showing a schematic cross-sectional side view of a photovoltaic device 240 having structured films comprised of nanorod materials, according to an illustrative embodiment. As shown in the photovoltaic device 240, a low-n optical coating/encapsulant 242 is coated over a high-n transparent material 244, such as $TiO_2$ or TCO. The nanorod embedded material 244 causes light scattering of incident light 205 into the wide band gap semiconductor 245 and through to the narrow band gap semiconductor 247. The scattered, refracted and reflected light 249 approaches the back nanorod TCO layer 252 coated on/with the back metal film 254, and is reflected back up into the narrow band gap semiconductor 247 and wide band gap semiconductor 245.

Reference is now made to FIG. 2D showing a schematic cross-sectional side view of a photovoltaic device 260 that results from conformal deposition of a nanostructured substrate, according to an illustrative embodiment. In accordance with the illustrative photovoltaic device 260 of FIG. 2D, conformal growth occurs on the nanostructured substrate to provide the desired light scattering properties. As shown, incident light 205 passes through a low-n optical coating 262 having conformal growth on the wide band gap semiconductor 265 causes scattering of the incident light 205. The light passes through to the narrow band gap semiconductor 268 and reaches the back low-n TCO layer 272 and back metal film 274. The low-n TCO layer also includes conformal growth on the nanostructured substrate to provide the desired scattering properties. The scattered, refracted and reflected light 270 is re-directed back into the photovoltaic device 260 to further improve the efficiency thereof.

Optically-Thin, Single-Junction Solar Cell

Figure 3:
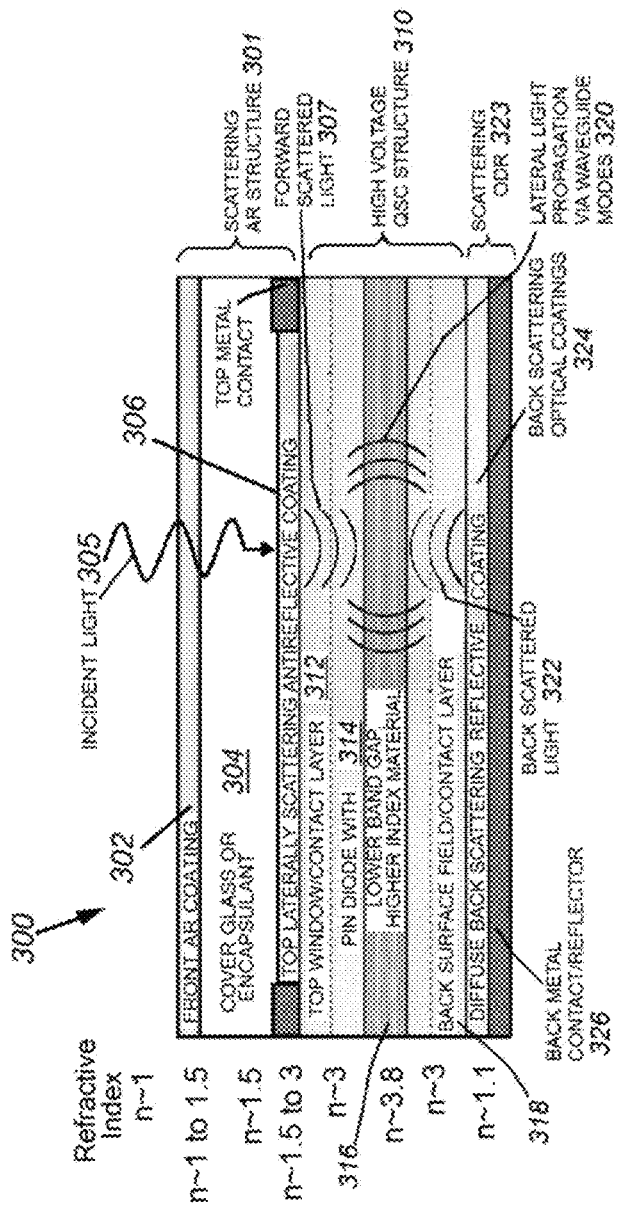
FIG. 3 is a schematic cross-sectional side view of an optically-thin solar cell that incorporates nanostructured, optical coatings to increase the optical path length of incident light through the active region of the photovoltaic device, according to an illustrative embodiment.

FIG. 3 depicts a device architecture for achieving high efficiency photovoltaic performance in an optically-thin single-junction solar cell. The device 300 consists of a high voltage semiconductor diode 314 embedded with lower band gap absorber material 316, sandwiched between a top antireflection (AR) structure 301 and a back Omni-directional reflector (ODR) structure 323. In this example, both the top AR structure 301 and back ODR structure 323 employ structured films to trap incident light and induce lateral scattering into the absorber layer structure 310.

The high voltage semiconductor diode 314 can employ an extended wide band gap emitter to reduce non-radiative dark current components. As previously discussed, the lower band gap, higher index material 316 can be comprised of single or multiple layers of quantum well, quantum dot, or quantum dot in a well layers, but is not limited to such quantum solar cell (QSC) structures. In particular the narrow band gap well or wells can be of a thickness beyond that at which quantum effects are observed. In general, the absorber layer structure 310 can comprise group III-V materials, group IV materials, or chalcogenide materials. Examples of lower band gap III-V materials include InGaAs alloys, InGaAsN and other dilute nitride materials, InN and high-indium content InGaN alloys, and InAsSb and related alloys.

The top AR structure 301 comprises a cover glass or encapsulant 304 with an appropriately designed AR coating 306 between the cover glass and the semiconductor diode, and optionally also a front AR coating 302. One or more of the components in the AR structure desirably contains structured materials that can both minimize reflection losses and induce lateral scattering of incident light into the underlying semiconductor diode 314 (shown as light propagation 320, 322). For example, laterally scattering antireflective coatings can employ porous layers, or layers of an optical film embedded with particles, or over-coated textured layers, as disclosed in commonly assigned patent applications (61/499,150 and 61/613,262). The cover glass 304 can also employ light scattering structures, such as the pseudomorphic glass described by Wilt et al. at the 37$^{th}$ IEEE PVSC.

The back reflector structure 323 can consist of a metal film 326, or a combination of a metal film 326 and low refractive index coatings 324, designed to maximize internal reflections. For CIGS-based solar cells, molybdenum (Mo) is typically employed as the back metal. However, molybdenum is a poor reflector. Therefore, an illustrative embodiment of a back reflector structure 323 mixes the molybdenum with a low refractive index material such as a TCO, $SiO_2$, or nanostructured $SiO_2$. In order to maintain the conductivity of the back reflector structure 323, the low-n material and the Mo can be enmeshed, forming a structured film. Such a structured film can be synthesized, for example, by etching a low-n film and then selectively depositing Mo within the openings in the low-n film. Alternatively, a Mo film can be etched, and a low-n material selectively deposited within the opening etched in the Mo film in accordance with ordinary skill. In addition, the back reflector 326 can contain structures that induce lateral optical scattering back into the semiconductor diode, structures such as the diffuse ODR structure disclosed in commonly assigned co-pending U.S. Provisional Pat. App. Ser. No. 61/499,142, entitled DIFFUSE OMNI-DIRECTIONAL BACK REFLECTORS AND METHODS OF MANUFACTURING THE SAME, by Roger E. Welser and Ashok K. Sood, filed Jun. 20, 2011, the teachings of which are expressly incorporated herein by reference, or other plasmonic or photonic crustal structures designed to maximize laterally propagating internal reflections, particularly at longer wavelengths that match the absorption band of the lower band gap absorber material in the overlying semiconductor diode.

The light trapping induced by the AR structure 301 and back ODR 323 in the device 300 depicted in FIG. 3 provides two distinct benefits for quantum solar cells and other optically-thin photovoltaic devices. First, it enables better use of the low volume of narrow band gap material by increasing the effective path length of incident photons though the absorber layer. Second, photon recycling of emitted photons provides a mechanism to increase the voltage of devices operating in the radiative limit.

Optical scattering into laterally propagating waveguide modes (see scattering 320) in particular provides a physical mechanism to dramatically increase photocurrent generation in optically-thin solar cells via in-plane light trapping. In general, the combination of a high voltage quantum solar cell structure and advanced light trapping concepts provides a pathway to achieve single-junction efficiencies exceeding 30% over a wide range of spectrums, including an AM0 space spectrum.

Optically-Thin Solar Cell with Multiple Junctions

The device concept for a high-efficiency, single-junction, optically-thin solar cell described herein with reference to FIG. 3 can also be extended in scope and employed as the bottom subcell in a multi-junction device to obtain even higher efficiency performance. Reference is now made to the multi-junction device 400 depicted in FIG. 4 which includes the insertion of a higher energy gap top subcell and appropriate tunnel junction.

In accordance with an illustrative embodiment, the antireflective structure 401 includes a front AR coating 402, a cover glass or encapsulant 404 and a top laterally scattering AR coating 406, to generate forward scattered light 407. The device 400 further includes the scattering ODR structure 423, which includes a diffuse back scattering reflective coating 424 and back metal contact/reflector 426. The back reflective coating generates the back scattered light 422 into the multijunction solar cell structure 410. The bottom subcell 416 has a top subcell 412 and appropriate tunnel junction 414 inserted between for optimum light scattering properties.

In an illustrative embodiment, when III-V materials are used to build the multi-junction structure, the top subcell can consist of a conventional, optically-thick cell such as the InGaP subcells employed in state-of-the-art multi-junction solar cells and routinely used for space power applications. The top subcell can also employ an extended wide band gap emitter structure, such as those detailed in commonly assigned co-pending U.S. patent application Ser. No. 12/719,811, entitled MULTIJUNCTION SOLAR CELL EMPLOYING EXTENDED HETEROJUNCTION AND STEP GRADED ANTIREFLECTION STRUCTURES AND METHODS FOR CONSTRUCTING THE SAME, by Roger E. Welser and Ashok K. Sood, filed Mar. 8, 2010, the teachings of which are each expressly incorporated herein by reference.

In an illustrative embodiment, to reduce the diode dark current below that obtained in conventional structures, wider energy-gap InGaP and AlGaAs material has been employed in the emitter and inserted into the depletion region adjacent to the emitter, forming an extended wide band gap emitter heterojunction structure. Single InGaAs quantum wells are located within the built-in field of the junction depletion region. The effective energy gap of the InGaAs well is a function of both the well composition and thickness, and can be quantified by photoluminescence (PL) emissions. In an illustrative embodiment, InGaAs quantum well solar cell structures are synthesized on semi-insulating GaAs substrates via metal-organic chemical vapor deposition (MOCVD).

The top subcell can also comprise narrow energy gap wells such as AlGaAs surrounded by InGaP or higher aluminum containing AlGaAs alloys. Tunnel junctions are required to electrically connect the subcells and are well described by prior art. Tunnel junctions are routinely used in state-of-the art multi-junction solar cells for space power applications.

Figure 4:
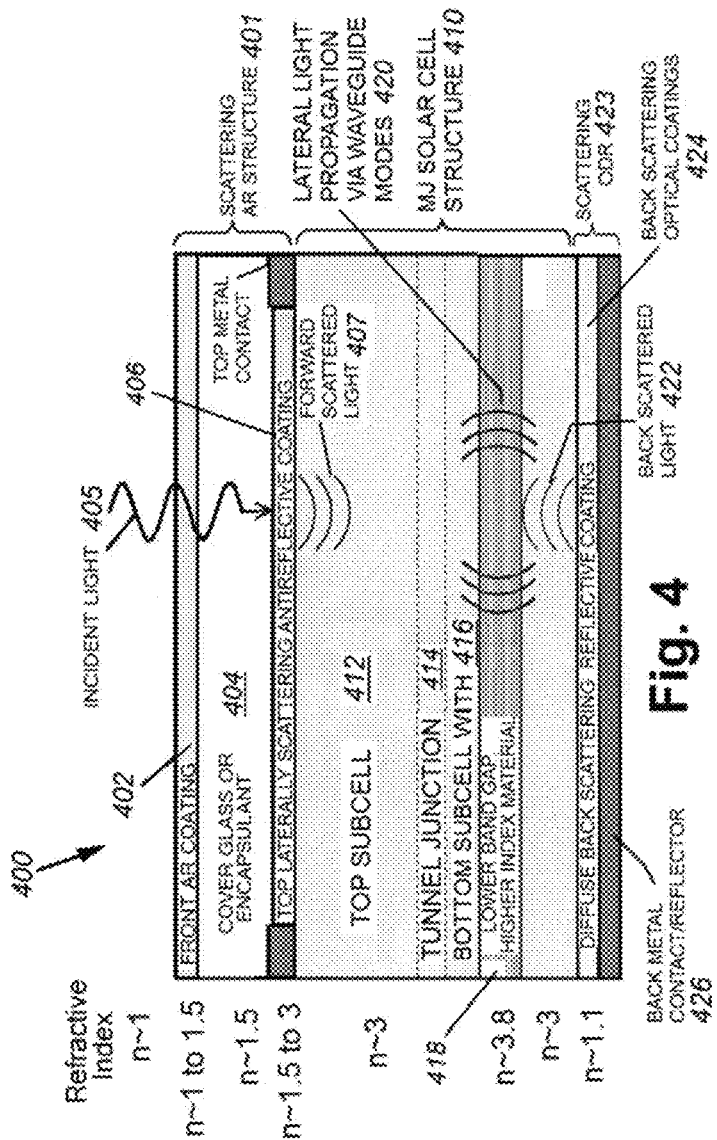
FIG. 4 is a schematic cross-sectional side view of an optically-thin solar cell having multiple junctions incorporating nanostructured, optical coatings to increase the optical path length of incident light through the active region of the photovoltaic device.

While the schematic shown FIG. 4 depicts a dual junction device, it is expressly contemplated that the device concept disclosed herein can be extended to devices with three or more junctions. One critical design criterion is that an optically-thin cell can be employed as the bottom subcell in order to fully benefit from the back reflector.

Optically-Thin, Dual-Junction Solar Cell Employing Chalcogenide Materials

Figure 5:
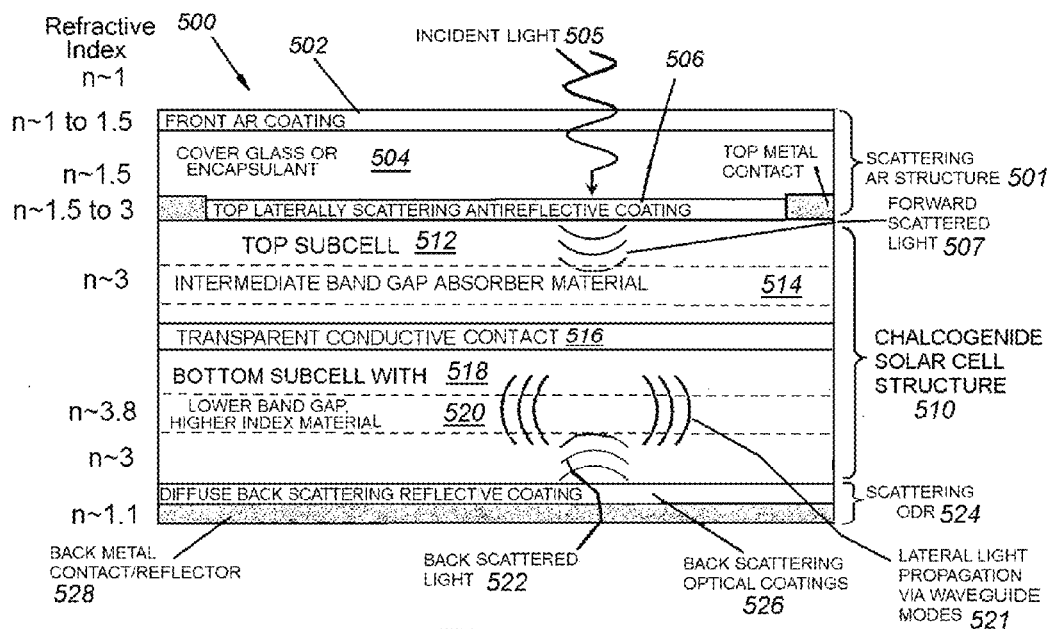
FIG. 5 is a schematic cross-sectional side view of an optically-thin solar cell having multiple junctions of chalcogenide materials which incorporate nanostructured, optical coatings to increase the optical path length of incident light through the active region of the photovoltaic device.

FIG. 5 depicts an optically-thin solar cell 500 with multiple junctions in which chalcogenide materials are employed to build the device. In accordance with an illustrative embodiment, an antireflection structure 501 and ODR structure 524 are provided with the chalcogenide solar cell structure 510 sandwiched between. The scattering AR structure 501 can include a front AR coating 502, a cover glass or encapsulant 504 and a top laterally scattering AR coating 506. The scattering AR structure 501 causes the forward scattered light 507 to scatter into the top subcell 512 having an intermediate band gap absorber material 514. The scattering ODR 524 includes a diffuse back scattering reflective coating 526, which generates the back scattered light 522, and also includes a back metal contact/reflector 528. The chalcogenide solar cell structure 510 comprises a top subcell 512 with intermediate band gap absorber material 514, a transparent conductive contact 516 to operatively connect the top subcell 512 with a bottom subcell 518 having a lower band gap, higher index material 520 embedded thereon. This material causes the lateral light propagation via wageguide modes 521.

In an illustrative embodiment, for example, the top subcell can comprise CIGS materials with low indium and high gallium content, while the bottom subcell can comprise CIGS materials with high indium and low gallium content. Either or both of the subcells can employ an extended wide band gap heterojunction emitter structure. For instance, the bottom subcell can comprise CIGS with very low gallium content (e.g. CIS or similar) embedded within CIGS with an intermediate Ga content (e.g. Ga~30%). The top subcell can comprise CIGS with higher gallium content (e.g. Ga~70%) embedded within CIGS with a very high Ga content (e.g. CGS or similar).

To maximize the optical path length through the chalcogenide semiconductor absorber layers, the top AR and back ODR structures can employ structured materials, as described herein above in greater detail. The structure can be fabricated by mechanically stacking and electrically connecting the two subcells, or other techniques known in the art. Mechanical stacking can be accomplished via the use of lift-off processes that remove the chalcogenide absorber layers from the mechanical substrates used for material deposition. The transparent conductive contact can consist of transparent conductive oxide materials, thin metal films, and/or patterned metal fingers, readily applicable to those of skill in the art.

It should now be clear the various features and advantageous that can be achieved by employing a photovoltaic device in accordance with the illustrative embodiment having enhanced light trapping and scattering properties. The optical path length can be optimized through use of scattering and antireflective coatings, as well as other techniques known in the art and readily applicable in view of the teachings herein.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A method of manufacturing a photovoltaic device comprising the steps of:
    depositing an enmeshed, structured film comprising molybdenum and a low refractive index material on a flexible sheet, the low refractive index material comprising at least one of TCO, $SiO_2$, or nanostructured $SiO_2$;
    depositing chalcogenide materials on the structured film;
    deposing transparent conductive oxide material on a top side of the chalcogenide materials; and
    forming a top metal contact grid.

2. The method of claim 1 in which nanostructured transparent conductive oxide material is added to the top metal contact grid.

3. The method of claim 1 further comprising:
    encapsulating the photovoltaic device with a transparent, low-refractive index front sheet.

4. The method of claim 3 in which the transparent front sheet contains a top most antireflective structure formed by oblique angle deposition.

5. The method of claim 1, wherein the enmeshed, structured film is formed by:
    etching the low refractive index material and;
    selectively depositing molybdenum within a plurality of openings in the low refractive index material.

6. The method of claim 1, wherein the enmeshed, structure film is formed by etching the molybdenum;
    selectively depositing the low refractive index material within a plurality of openings etched in the molybdenum.

7. The method of claim 1, wherein the chalcogenide materials comprise at least one chalcogenide semiconductor.

8. The method of claim 7, wherein the at least one chalcogenide semiconductor comprises:
    a first subcell comprising CIGS materials, a first indium content and a first gallium content; and
    a second subcell comprising CIGS materials, a second indium content different from the first indium content and a second gallium content different from the first gallium content.

* * * * *